United States Patent [19]

Assard et al.

[11] Patent Number: 4,523,120
[45] Date of Patent: Jun. 11, 1985

[54] PRECISE BEARING SUPPORT DITHERER WITH PIEZOELECTRIC DRIVE MEANS

[75] Inventors: Gerald L. Assard, Waterford; Arthur L. Moorcroft, Norwich, both of Conn.

[73] Assignee: The United States of America as represented by the Secretary of the Navy, Washington, D.C.

[21] Appl. No.: 617,049

[22] Filed: Jun. 4, 1984

[51] Int. Cl.$^3$ .......................................... H01L 41/08
[52] U.S. Cl. ................................. 310/323; 310/317; 310/328; 310/331; 310/333
[58] Field of Search .............. 310/331, 328, 319, 330, 310/332, 323, 333, 317; 384/129, 195, 220, 295, 297; 369/144

[56] References Cited

U.S. PATENT DOCUMENTS

| | | | |
|---|---|---|---|
| 2,439,499 | 4/1948 | Williams | 310/331 |
| 2,979,573 | 4/1961 | Kuhn | 369/144 X |
| 3,073,914 | 1/1963 | Germano et al. | 369/144 X |
| 3,146,367 | 8/1964 | McNaney | 310/331 X |
| 3,167,667 | 1/1965 | Lusko | 310/328 |
| 3,526,726 | 9/1970 | Corbett et al. | 310/331 X |
| 3,835,338 | 9/1974 | Martin | 310/331 |
| 3,928,778 | 12/1975 | Ivanov et al. | 310/331 |
| 4,087,715 | 5/1978 | Myer | 310/328 X |
| 4,099,876 | 7/1978 | Dorsman | 310/317 X |
| 4,349,183 | 9/1982 | Wirt et al. | 310/328 X |
| 4,423,347 | 12/1983 | Kleinschmidt | 310/331 |
| 4,468,583 | 8/1984 | Mori | 310/333 X |

*Primary Examiner*—Mark O. Budd
*Attorney, Agent, or Firm*—Robert F. Beers; Arthur A. McGill; Michael J. McGowan

[57] ABSTRACT

A relatively solid mounting surface, which may be part of a leveling gimbal, supports a piezoelectric bearing mount which has the properties of an acoustic transducer. The transducer has electrodes thereon which are powered from multi-phase electrical sources causing the bearing mount, and a bearing jewel which is rigid therewith, to move so as to dither the jewel in a rotary or other preselected fashion, thereby reducing bearing friction. Bandwidth, level and phasing sequence of the power sources are adjustable permitting optimized average dynamic motion and corresponding increased readout accuracy.

4 Claims, 5 Drawing Figures

PRECISE BEARING SUPPORT DITHERER WITH PIEZOELECTRIC DRIVE MEANS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to a device for improving the readout accuracy of precision measuring instruments and more particularly to a bearing support ditherer which acts to replace static bearing friction with the corresponding lower value of dynamic friction by selectively vibrating the bearing mount so as to produce a random or pseudo-random rotary planar motion of the bearing.

(2) Description of the Prior Art

It is well known that readout accuracies of high quality measuring instruments such as compasses are limited by the finite friction of their bearings. This bearing friction can be reduced by vibrating the instrument, thereby causing static bearing friction to be replaced by a lower value of dynamic friction. Modern quantized instrument electrical readouts have the capability of providing accuracies much greater than now obtainable mechanically due to the presence of such static bearing friction. The static friction of precise bearings has been previously reduced by; use of jeweled bearings, vibrating the entire sensing unit in order to pass motion to the bearing or by periodic or randomized dynamic altering (movement) of the sensing unit or of the force field being sensed followed by averaging the readout. Further, because compass readout accuracy is generally proportional to physical size, reduction of bearing friction is required in order to permit production of smaller units which have the readout accuracy of present larger units.

SUMMARY OF THE INVENTION

Accordingly, it is a general purpose and object of the present invention to provide a device permitting more accurate readout from precision measuring instruments. It is a further object that such an accuracy producing device operate at low power levels. Another object is that such device be suitable for use as a gimbal base. A still further object is to selectively dither the sensing device so as to produce relatively low dynamic friction. Still another object is that such ditering signal be random, pseudo-random or periodic in character.

These objects are accomplished with the present invention by providing a device comprising a relatively rigid, non-magnetic mounting surface, such as part of a leveling gimbal, for supporting a piezoelectric bearing mount having the properties of an acoustic transducer, which bearing mount is powered via wires from a pair of multi-phase electrical sources. A selected electrical signal causes the bearing mount and hence the bearing jewel affixed thereto to move dynamically in a circular plane, thereby reducing bearing friction between the jewel and the readout indicator which it supports. The bandwidth, level and phase sequence of the driving signal is adjustable to permit random, pseudo-random or periodic dynamic dithering of the indicator thus allowing readout accuracy to be increased through averaging of the dynamic motion of the readout pointer.

A more complete understanding of the invention and many of the attendant advantages thereto will be readily appreciated as the same becomes better understood by reference to the following detailed description when considered in conjunction with the accompanying drawings wherein:

DESCRIPTION OF THE PREFERRED EMBODIMENT

Figure 1:
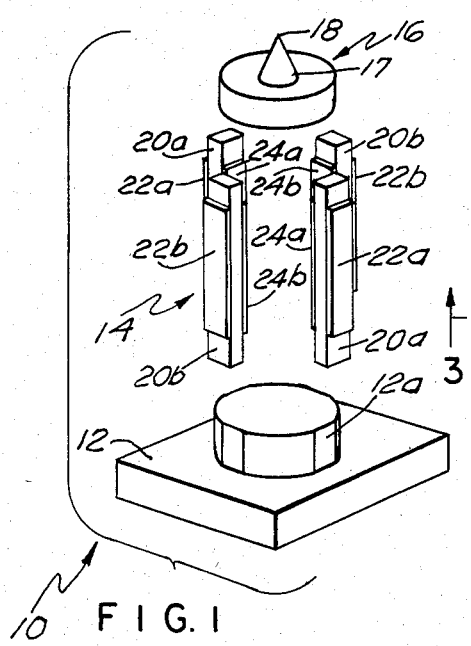
FIG. 1 shows a dithering device built according to the teachings of the present invention.

Referring now to FIG. 1 there is shown a bearing support ditherer 10 comprising a rigid, non-magnetic support base 12 which may be non-polarized ceramic or the like, a piezoelectric dithering means 14 fixedly attached to base 12 and having the properties of an acoustic transducer, and a jewel bearing support 16 movably attached to dithering means 14 having a cone shaped mounting protrusion 17 extending therefrom for supporting a jewel bearing 18. Bearing 18 can support a plurality of readout indicators such as compass needles or compass cards. Compass cards permit remote reading by employing a photodetector and a plurality of holes at locations on the card corresponding to incremental compass directions. A large number of holes thus give fine accuracy. Dithering means 14 further includes a first pair of vertically extending, rectangular, active ceramic members 20a such as right hexahedrons and a second identical pair of vertically extending rectangular active parallel ceramic members 20b arranged orthogonally with respect to said first pair of members 20a. Members 20a and 20b are fixedly bonded at the lower ends thereof to matching vertical surfaces 12a on base 12 using an adhesive such as epoxy or the like. Each of members 20a and 20b have external metal electrodes 22a and 22b and internal metal electrodes 24a and 24b respectively, conductively affixed thereto, for driving ceramic members 20a and 20b which are selectively polarized so as to allow controlled cantilever motion of the unsupported top ends of the members as applied electrode voltage changes.

Bearing support ditherer 10 is thus a vibrating bearing mount constructed from piezoelectric material which can convert applied dynamic electric fields into desired mechanical motion in a rotary plane. The driving electrical signals can be periodic, random or pseudo random to create bearing motion with small dynamic rotary components which allow the sampled and averaged instrument reading to be more precise than is possible with stationary bearings. The dithering rate is high relative to the readout sample rate, e.g., 1000 to 1.

Figure 2:
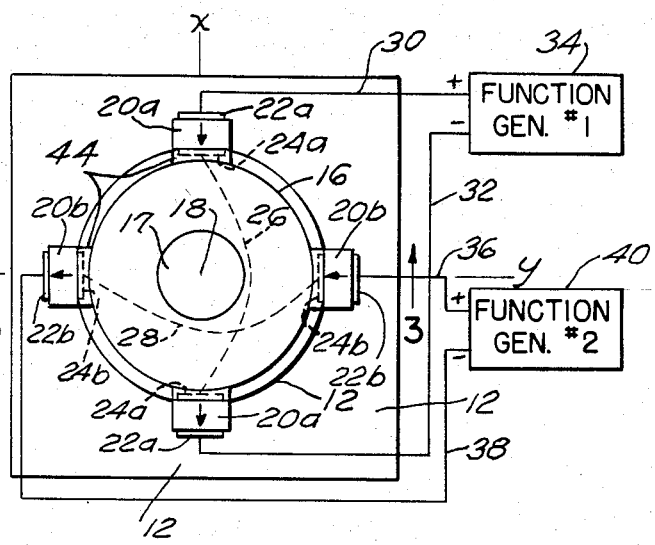
FIG. 2 shows a top view of the device of FIG. 1.

FIG. 2 shows a top view of the ditherer 10 of FIG. 1 according to the preferred polarization for the present invention. Non-adjacent vertical member pairs 20a and 20b are electrically connected as shown. Internal electrodes 24a are interconnected by conductor 26. External electrodes 22a are powered via conductors 30 and 32 from a first multiphase electrical function generator 34, the direction of polarization being shown by vectors on members 20a. Generator 34 can generate a wide variety of functions, e.g., random, pseudo-random, periodic, etc. Electrical signals from generator 34 cause members 20a, support 16 and bearing jewel 18 to move dynamically in the x direction in a preselected pattern. Members 20b are interconnected by conductor 28 between electrodes 24b. External electrodes 22b receive power from conductors 36 and 38 from a second function generator 40. Signals from generator 40 cause members 20b, support 16 and bearing jewel 18 to move dynamically in the y direction. The combined x-y movement produces the rotary motion of jewel 18. The bandwidth, level and phasing sequence of the driving signals are adjusted to cause dynamic dithering of the indicator which allows readout accuracy to be increased through reducing the bearing friction and averaging of the dynamic motion. Members 20a and 20b are movably bonded to support 16 by means of a non-magnetic elastomer 44 such as silicon rubber or the like. Also, member pairs 20a and 20b, and hence quadrants, can be connected and driven in parallel in addition to the series arrangement shown in FIG. 2.

Figure 3:
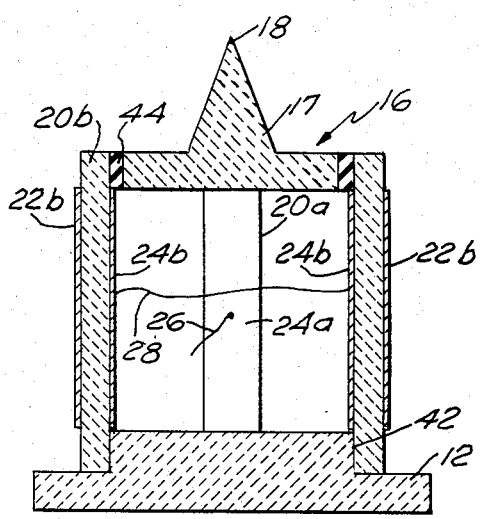
FIG. 3 shows a vertical cross-sectional view of the device of FIG. 2 taken along line 3—3 thereof.

FIG. 3 shows a vertical cross section of bearing support ditherer 10 taken along line 3—3 of FIG. 2. Bearing support 16 is flexibly bonded to the top of each pair of members 20a and 20b by means of elastomer 44. Bottom joints 42 are rigid bonds between members 20a and 20b and base 12 at surfaces 12a. Elastomer 44 permits radial movements of segments 20 to occur which in turn transmits such motion to support 16 and jewel 18. By selectively varying the strength, waveform and phase of the driving signals from generators 34 and 40, a wide variety of vibratory motions are attainable for jewel 18.

Figure 4:
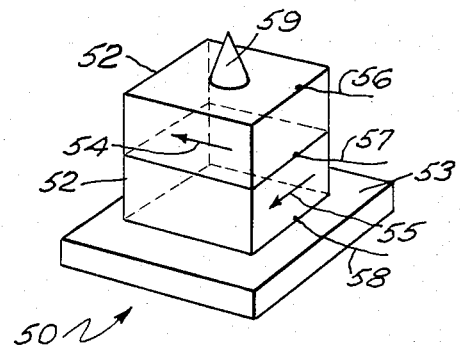
FIG. 4 shows an alternate embodiment of a device according to the present invention.

An alternate bearing ditherer embodiment 50 is shown in FIG. 4. Shearing motion is induced in two or more stacked rectangular blocks 52 of piezoceramic material, the lower one of which is fixedly mounted on a stationary, non-magnetic material base 53 similar to support 12 above. Blocks 52 are polarized horizontally as shown by polarization vector arrows 54 and 55 which are disposed orthogonal with respect to each other. Three horizontal surface electrodes are connected to wires 56, 57 and 58. No voltage is applied in this view so as to show blocks 52 in their "at rest" position in FIG. 4. A bearing mount protrusion 59 is affixed to the upper surface of top block 52. The assembly is then fixedly bonded together by epoxy or the like.

Figure 5:
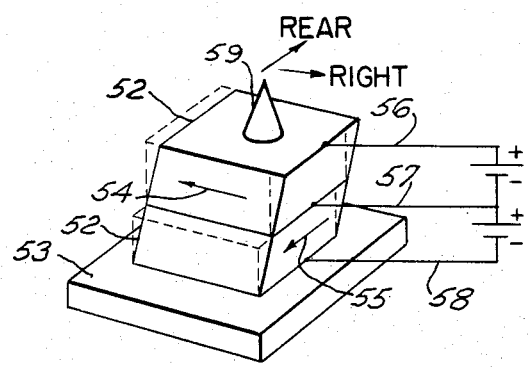
FIG. 5 shows induced dithering motion for the device of FIG. 4.

FIG. 5 shows an example of induced shear motion of bearing mount 50 as instantaneous voltage is applied as shown between electrodes 56, 57 and 58. Each ceramic block 52 shifts its top electroded surface with respect to its bottom electroded surface in a direction opposite to vectors 54 and 55 in a controlled manner depending on the preselected applied voltage level and polarity. Application of instantaneous voltage as shown causes the bottom block 52 to move its top surface to the rear while upper block 52's top surface moves both to the right and to the rear. The applied supply voltage shown in FIG. 5 thus causes the bearing pivot point to move to the right and to the rear. Dynamic control of the driving voltage level and phase from function generators such as those described in FIG. 2 to the two blocks allows the pivot point dynamic motion to be controlled in two directions for dithering of the supported indicator.

An advantage of the present bearing ditherer over previous vibratory schemes is that the described precise bearing ditherer requires less operating power, generates less mechanical interference than previous methods and can operate continuously and automatically. The piezoelectric dithering means can efficiently convert low power electric fields to dynamic mechanical bearing motion. The applied electrical signals can be selected to produce a random motion with essentially no rotary component or it can induce an alternating dynamic rotary bearing motion which dithers the sensing element back and forth with reference to the desired pointing direction. This ditering motion can then be eliminated from readouts by averaging the sampled indicator readings to obtain a more precise directional reading than is possible with fixed bearings.

What has thus been described is a device comprising a relatively solid mounting surface, such as part of a leveling gimbal, for supporting a piezoelectric bearing mount having the properties of an acoustic transducer, which transducer is powered via wires from multiphase electrical sources. The electrical signals cause the bearing mount and the bearing jewel to move dynamically in a rotary or other chosen plane, thereby reducing bearing friction. The bandwidth, level and phase sequence of the driving signals are adjustable to permit random, pseudo-random or periodic dynamic dithering of the indicator allowing readout accuracy to be increased through averaging of the dynamic motion of the indicator.

Obviously many modifications and variations of the present invention may become apparent in light of the above teachings. For example, bearing motion could be induced by electromagnetic or mechanical means, or it could be coupled to the bearing support instead of being part of the mount. The precise bearing support ditherer could be employed to improve the performance of any instrument that requires precision bearings. Driving signals could be either analog or digital. Electrical power could be coupled via capacitive electrodes surrounding the compass or other precision sensor eliminating the need for conducting wires through gimbals or bearings. If the entire device is enclosed, an aperture can be provided in base 12 to permit electrical connection to the internal electrodes.

In light of the above, it is therefore understood that within the scope of the appended claims, the invention may be practiced otherwise than as specifically described.

What is claimed is:

1. An apparatus for dithering a jewel bearing supporting a precision instrument readout indicator, comprising:
   a rigid, non-magnetic support base having a vertical axis and horizontal x and y axes;
   piezoceramic dithering means, extending vertically upward from said support base, the bottom end thereof being fixedly attached to said support base while the top end thereof is free to move, for controllably moving said dithering means top end in preselected x and y directions;
   a first function generating means, connected to said dithering means, for selectively providing a first variable electrical potential to said dithering means thereby controllably producing said x direction motion;
   a second function generating means, connected to said dithering means, for selectively providing a second variable electrical potential to said dithering means thereby controllably producing said y direction motion, said x motion in conjunction with said y motion thereby producing combined x-y planar motion;

first electrode means, connected to said first function generating means and fixedly attached to first preselected areas of said dithering means such that said first electrical potential, in conjunction with preselected dithering means piezoceramic polarization, produces said x direction motion of said dithering means top end;

second electrode means, connected to said second function generating means and fixedly attached to second preselected areas of said dithering means such that said second electrical potential, in conjunction with preselected dithering means piezoceramic polarization, produces said y direction motion of said dithering means top end; and a bearing support, attached to said dithering means, for supporting said jewel bearing, whereby said jewel bearing moves in direct proportion to said combined x-y motion of said dithering means thereby producing dynamic friction between said jewel bearing and said indicator such that, by averaging readouts therefrom, greater accuracy is achieved.

2. An apparatus according to claim 1 wherein said dithering means further comprises:

a first rectangular piezoceramic block having said first electrode means further comprise first and second electrodes fixedly attached to the entire top and bottom horizontal surfaces thereof, said bottom surface then being fixedly attached to said support base such that upon application of said first electrical potential, said x direction motion is achieved; and a second rectangular piezoceramic block having said first electrode means further comprise first and second electrodes fixedly attached to the entire top and bottom horizontal surfaces thereof, said bottom surface thereof then being orthagonally oriented with respect to and fixedly attached to said top surface of said first block, such that upon application of said second electrical potential, said y direction motion is achieved;

said bearing support being rigidly attached to the top surface of said second rectangular block.

3. An apparatus according to claim 1 wherein said dithering means further comprises:

a first pair of vertically extending, piezoceramic, parallel right hexahedrons spaced a preselected distance apart, each said hexahedron being fixedly attached at the bottom thereof to said support base and flexibly attached at the top thereof to said bearing support, each said hexahedron further having vertically disposed internal and external electrodes attached thereto, said internal electrodes of said first pair being electrically connected to each other while said external electrodes are electrically connected to said first function generating means such that upon application of said first electrical potential, said x direction motion is achieved; and a second pair of vertically extending, piezoceramic, parallel right hexahedrons, attached, electroded and connected identically to said first pair of hexahedrons but being oriented orthagonally thereto and being electrically connected to said second function generating means such that upon application of said second electrical potential, said y direction motion is achieved;

said bearing support being flexibly bonded to the top ends of said first and second pairs of hexahedrons, cantilever motion thereof is thus permitted.

4. An apparatus according to claim 3 wherein said flexible bond is a non-magnetic elastomer.

* * * * *